United States Patent
Li et al.

(10) Patent No.: US 12,512,848 B2
(45) Date of Patent: Dec. 30, 2025

(54) PIPELINED SUCCESSIVE APPROXIMATION REGISTER ANALOG-TO-DIGITAL CONVERTER, INTEGRATED CIRCUIT, AND ELECTRONIC DEVICE

(71) Applicant: SANECHIPS TECHNOLOGY CO., LTD., Guangdong (CN)

(72) Inventors: Dengquan Li, Guangdong (CN); Henghui Mao, Guangdong (CN); Xuewei Ding, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 123 days.

(21) Appl. No.: 18/709,097

(22) PCT Filed: Mar. 2, 2022

(86) PCT No.: PCT/CN2022/078889
§ 371 (c)(1),
(2) Date: May 10, 2024

(87) PCT Pub. No.: WO2023/092887
PCT Pub. Date: Jun. 1, 2023

(65) Prior Publication Data
US 2025/0038762 A1   Jan. 30, 2025

(30) Foreign Application Priority Data
Nov. 24, 2021 (CN) .......................... 202111407728.2

(51) Int. Cl.
*H03M 1/46* (2006.01)
*H03M 1/12* (2006.01)
(Continued)

(52) U.S. Cl.
CPC .......... *H03M 1/462* (2013.01); *H03M 1/1205* (2013.01); *H03M 1/12* (2013.01); *H03M 1/34* (2013.01); *H03M 1/38* (2013.01)

(58) Field of Classification Search
CPC ...... H03M 1/462; H03M 1/1205; H03M 1/34; H03M 1/38; H03M 1/12
See application file for complete search history.

(56) References Cited

U.S. PATENT DOCUMENTS

2010/0142653 A1\* 6/2010 Furuta ................. H03M 1/0682
341/158

FOREIGN PATENT DOCUMENTS

| CN | 107425852 A | 12/2017 |
|---|---|---|
| CN | 110198169 A | 9/2019 |

OTHER PUBLICATIONS

Chen, Kairang, et al. "A pipelined SAR ADC with gain-stage based on capacitive charge pump," Analog Integr Circ Sig Process (2017) 90:43-53, published on Oct. 11, 2016.
(Continued)

*Primary Examiner* — Joseph J Lauture
(74) *Attorney, Agent, or Firm* — Li & Cai Intellectual Property (USA) Office

(57) ABSTRACT

Disclosed are a pipelined successive approximation register analog-to-digital converter, an integrated circuit, and an electronic device. The pipelined successive approximation register analog-to-digital converter includes: a first-stage successive approximation register analog-to-digital converter (10), a residue amplifier (30), a second-stage successive approximation register analog-to-digital converter (20), and a digital coding unit (40).

17 Claims, 2 Drawing Sheets

(51) Int. Cl.
*H03M 1/34* (2006.01)
*H03M 1/38* (2006.01)

(56) References Cited

OTHER PUBLICATIONS

Chen, Kairang, et al "Design of a 12.8 ENOB, 1 KS/s pipelined SAR ADC in 0.35-μm CMOS," Analog Integr Circ Sig Process (2016) 86:87-98, published on Oct. 18, 2015.
European Patent Office, the Extended European Search Report dated Sep. 25, 2025, for corresponding EP application No. 22896989.5.

* cited by examiner

PIPELINED SUCCESSIVE APPROXIMATION REGISTER ANALOG-TO-DIGITAL CONVERTER, INTEGRATED CIRCUIT, AND ELECTRONIC DEVICE

CROSS-REFERENCE TO RELATED APPLICATIONS

The present application is a National Phase Application filed under 35 U.S.C 371 as a national stage of PCT/CN2022/078889, filed on Mar. 2, 2022 claiming priority from the Chinese patent application No. 202111407728.2 filed on Nov. 24, 2021, the entire disclosure of which is incorporated herein by reference.

TECHNICAL FIELD

The disclosure relates to a field of integrated circuit technology, and in particular, to a pipelined successive approximation register analog-to-digital converter, an integrated circuit, and an electronic device.

BACKGROUND

The pipelined successive approximation register analog-to-digital converter (pipelined SAR ADC) has been widely used in various ADC scenarios due to a relatively high speed and high accuracy. The pipelined SAR ADC generally includes at least two stages of SAR ADCs, each having a digital-to-analog converter (DAC), a comparator, and an SAR logic unit, and a residue amplifier is provided between the DACs of two adjacent stages of SAR ADCs, to amplify a sampling residual signal of a previous stage of SAR ADC and then transmit the amplified signal to a next stage of SAR ADC. In a deep submicron CMOS process, the intrinsic gain of the transistor is gradually reduced, making it difficult to implement high-gain linear amplification by the residue amplifier. In view of this technical problem, the existing art proposes to reduce a reference voltage in the next stage of ADC to half of a reference voltage in the previous stage of ADC, so as to implement inter-stage gain halving of the two-stage structure, and reduce a gain of the residue amplifier. However, the halved reference voltage may greatly reduce the conversion speed and the power consumption of the ADC.

SUMMARY

An embodiment of the present disclosure provides a pipelined successive approximation register analog-to-digital converter, an integrated circuit, and an electronic device.

In a first aspect, an embodiment of the present disclosure provides a pipelined successive approximation register analog-to-digital converter, including: a first-stage successive approximation register analog-to-digital converter, including a first digital-to-analog converter, a first comparator and a first digital control logic unit sequentially connected, wherein the first digital-to-analog converter includes a first capacitor array having one first complement bit capacitor and M bit first capacitors, a first end of the first complement bit capacitor and a first end of each of the first capacitors are respectively connected to an analog input voltage, a second end of each of the first capacitors is connected to a positive going reference voltage or a negative going reference voltage through a multi-way selection switch, and a second end of the first complement bit capacitor is connected to a negative going reference voltage; a capacitance value of the first complement bit capacitor is equal to a capacitance value of a first bit capacitor in the M bit first capacitors, and capacitance values of the M bit first capacitors are sequentially increased by a power of 2 from small to large according to the number of bits, where M is an integer larger than 1; a residue amplifier having an input end connected to a residual voltage output from the first digital-to-analog converter; a second-stage successive approximation register analog-to-digital converter, including a second digital-to-analog converter, a second comparator and a second digital control logic unit sequentially connected, wherein the second digital-to-analog converter includes a second capacitor array having one gain halving capacitor, one second complement bit capacitor, and N−1 bit second capacitors, a first end of the gain halving capacitor, a first end of the second complement bit capacitor, and a first end of each of the second capacitors are respectively connected to an output end of the residue amplifier, a second end of each of the second capacitors is connected to a positive going reference voltage or a negative going reference voltage through a multi-way selection switch, and a second end of the gain halving capacitor, and a second end of the second complement bit capacitor are respectively connected to a negative going reference voltage, a capacitance value of the second complement bit capacitor is equal to a capacitance value of a first bit capacitor in the N−1 bit second capacitors, capacitance values of the N−1 bit second capacitors are sequentially increased by a power of 2 from small to large according to the number of bits, and a capacitance value of the gain halving capacitor is a sum of the capacitance values of the N−1 bit second capacitors and the second complement bit capacitor, where N is an integer greater than 1; and a digital coding unit connected to output ends of the first digital control logic unit and the second digital control logic unit.

In a second aspect, an embodiment of the present disclosure provides an integrated circuit, including a pipelined successive approximation register analog-to-digital converter as described in the first aspect.

In a third aspect, an embodiment of the present disclosure provides an electronic device, including an integrated circuit as described in the second aspect.

DETAIL DESCRIPTION OF EMBODIMENTS

Figure 1:
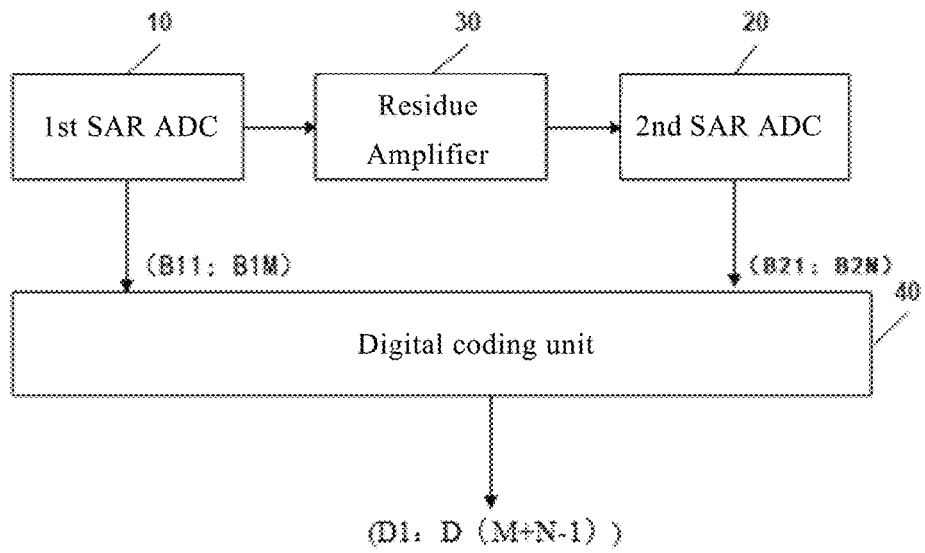
FIG. 1 is a block diagram of a pipelined successive approximation register analog-to-digital converter according to an embodiment of the present disclosure.

The technical solutions in the embodiments of the present disclosure will be described below with reference to the drawings in the embodiments of the present disclosure, and it is obvious that the described embodiments are only some, but not all, embodiments of the present disclosure. All other embodiments obtained by a person of ordinary skill in the art based on the embodiments in the present disclosure without any creative labor belong to the protection scope of the present disclosure.

It will be appreciated that in the description of the embodiments of the present disclosure, should there be any reference to "first", "second" or the like, it is merely intended to distinguish technical features, instead of being interpreted as indicating or implying any relative importance or implying any number of the indicated technical features or implying any precedence of the indicated technical features. The phrase "at least one" means one or more, and "a plurality" means two or more. The term "and/or" describes an association relationship of associated objects, which may include three relationships; for example, A and/or B may refer to: A alone, A and B, or B alone, where A and B may be in singular or plural forms. The character "/" generally indicates that the former and latter associated objects are in an "or" relationship. The phrase "at least one of" and similar expressions refer to any group of the listed items, including any combination of one or more of the listed items. For example, at least one of a, b or c may represent: a, b, c, a and b, a and c, b and c, or a and b and c, where a, b and c may be in single or multiple forms.

To facilitate understanding of the technical solutions in the embodiments of the present disclosure, a brief description of the pipelined successive approximation register analog-to-digital converter in the existing art is firstly given below.

A pipelined successive approximation register analog-to-digital converter generally includes multiple stages of SAR ADCs and is configured to encode digital signals output from the multiple stages of SAR ADCs and output final digital signals converted from analog input signals.

Each stage of SAR ADC mainly includes three parts: a digital-to-analog converter (DAC), a comparator, and an SAR logic unit. The basic working principle of each stage of SAR ADC is as follows: in the first period after sampling, the most significant bit (MSB) of the DAC is set to 1, while other bits are set to 0, and initial values (typically half of a full-scale voltage) of the analog input voltage and the DAC output voltage is compared by the comparator. If the analog input voltage is greater than the DAC output voltage, a current bit is coded to 1, while an on/off state of the DAC remains unchanged; and if the analog input voltage is less than the DAC output voltage, the current bit is coded to 0, while the on/off state of the DAC returns to a state before the action. Then, the SAR logic moves to a next bit, where the on/off state of the DAC is changed again, and a comparison with the analog input voltage is performed, so on and so forth, until a last bit is compared and all A/D conversion codes are obtained. A core idea of the SAR ADC working principle is a bisection method, where the DAC output voltage is changed by ½ each time and successively approximate the analog input voltage, thereby implementing analog-to-digital conversion.

For the pipelined successive approximation register analog-to-digital converter, a residue amplifier is provided between the DACs of two adjacent stages of SAR ADCs, and configured to amplify a residue (residual voltage) of the analog input voltage of a previous stage of SAR ADC to be used as an analog input for a next stage of SAR ADC.

In a deep submicron CMOS process, the intrinsic gain of the transistor is gradually reduced, making it difficult to implement high-gain linear amplification by the residue amplifier. In view of this technical problem, the existing art proposes to reduce a reference voltage in the next stage of SAR ADC to half of a reference voltage in the previous stage of SAR ADC, so as to implement inter-stage gain halving of the two-stage structure, and reduce a gain of the residue amplifier. For example, if the previous stage of SAR ADC has M bits, an amplification factor of the residue amplifier should be set to at least $2^{M-1}$, and through the inter-stage gain halving technique, the amplification factor of the residue amplifier can be reduced to $2^{M-2}$. However, halving the inter-stage gain by halving the reference voltage will greatly reduce the conversion speed and the power consumption of the ADC.

In summary, the conventional pipelined successive approximation register analog-to-digital converter of two or more stages has the defect of a high gain of the residue amplifier, and thus is not suitable for a deep submicron CMOS process. The method of halving the reference voltage in the existing art, although can halve the inter-stage gain, will restrict the overall speed and precision of the pipelined successive approximation register analog-to-digital converter, and thus increase the power consumption. In view of this, an embodiment of the present disclosure provides a pipelined successive approximation register analog-to-digital converter, an integrated circuit, and an electronic device which can be used to halve the inter-stage gain without halving the reference voltage, thereby increasing the conversion speed and reducing the power consumption of the ADC.

Referring to FIG. 1, FIG. 1 is a block diagram of a pipelined successive approximation register analog-to-digital converter according to an embodiment of the present disclosure. As shown in FIG. 1, the pipelined successive approximation register analog-to-digital converter according to the embodiment of the present disclosure includes: a first-stage successive approximation register analog-to-digital converter 10, a residue amplifier 30, a second-stage successive approximation register analog-to-digital converter 20, and a digital coding unit 40. The first-stage successive approximation register analog-to-digital converter 10 is connected to the second-stage successive approximation register analog-to-digital converter 20 through the residue amplifier 30, and the first-stage successive approximation register analog-to-digital converter 10 and the second-stage successive approximation register analog-to-digital converter 20 are respectively connected to the digital coding unit 40.

It will be understood that the first-stage successive approximation register analog-to-digital converter 10 (hereinafter "the first SAR ADC") in the embodiment of the present disclosure is configured as an M bit SAR ADC, that is, the first SAR ADC is configured to output M bit digital signals to the digital coding unit 40, where M is an integer greater than 1. the second-stage successive approximation register analog-to-digital converter 20 (hereinafter "the second SAR ADC") in the embodiment of the present disclosure is configured as an N bit SAR ADC, that is, the second SAR ADC is configured to output N bit digital signals to the digital coding unit 40, where N is an integer greater than 1. The digital coding unit 40 encodes the M bit digital signals (B11:B1M) output from the first SAR ADC and the N bit digital signals (B21:B2N) output from the second SAR ADC by an inter-stage dislocation accumulation method, to obtain the final (M+N−1) bit binary digital signals (D1:D(M+N−1)).

Figure 2:
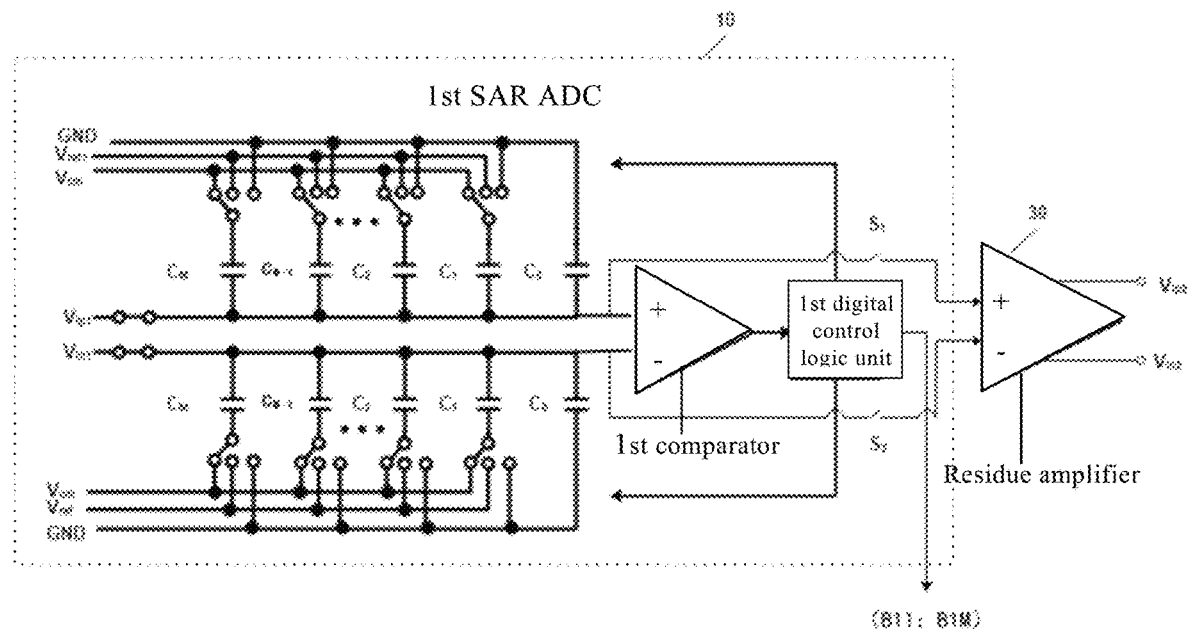
FIG. 2 is a schematic circuitry diagram of a first-stage successive approximation register analog-to-digital converter according to an embodiment of the present disclosure.

Referring to FIG. 2, a schematic circuitry diagram of a first SAR ADC according to an embodiment of the present disclosure is shown. The first SAR ADC includes a first digital-to-analog converter, a first comparator and a first digital control logic unit sequentially connected. The first digital-to-analog converter includes a first capacitor array having one first complement bit capacitor $C_0$ and M bit first capacitors $C_1$ to $C_M$.

Capacitance values of the M bit first capacitors $C_1$ to $C_M$ are sequentially increased by a power of 2 from small to large according to the number of bits. The capacitance value of a first capacitance $C_i$ may be expressed by: $C_i=2^{i-1}*CU$, where i=an integer selected from any one of 1 to M, and CU is a unit capacitance.

A capacitance value of the first complement bit capacitor $C_0$ is equal to a capacitance value of a first bit capacitor $C_1$ in the M bit first capacitors, i.e., $C_0=CU$.

As shown in FIG. 2, a first end of the first complement bit capacitor $C_0$ and a first end of each of the first capacitors $C_1$ to $C_M$ are respectively connected to an analog input voltage; a second end of each of the first capacitors $C_1$ to $C_M$ is connected to a positive going reference voltage $V_{ref}$ or a negative going reference voltage through a multi-way selection switch (in this example, a reference ground GND is used as the negative going reference voltage), and a second end of the first complement bit capacitor $C_0$ is constantly connected to a negative going reference voltage.

It will be understood that the analog input voltage may be connected to an input end of the first digital to analog converter by a sample and hold circuit (S/H). A/D conversion of an analog signal takes some time, within which the analog signal has to remain substantially unchanged to ensure the conversion precision. The sample and hold circuit is a circuit for this purpose.

As shown in FIG. 2, the first SAR ADC samples the analog input voltage by an upper plate. In the first SAR ADC, the upper plate of each capacitor is connected to the analog input voltage, while lower plates of the M bit first capacitors $C_1$ to $C_M$ are connected to multiple reference signal sources through a multi-way selection switch. Exemplarily, each reference signal source may include a positive going reference voltage $V_{ref}$ and a negative going reference voltage (in this example, the reference ground GND is used as the negative going reference voltage). In some examples, the reference signal source further includes a common mode voltage $V_{CM}$. A lower plate of the first complement bit capacitor $C_0$ is constantly connected to a negative going reference voltage.

In the example shown in FIG. 2, the first SAR ADC adopts a differential upper plate sampling mode, and analog input voltages input to the first SAR ADC are differential voltages $V_{ip1}$ and $V_{in1}$, where $V_{ip1}$ is a positive going analog input voltage, and $V_{in1}$ is a negative going analog input voltage. In the upper plate differential sampling mode, two first capacitor arrays with the same structure are provided in the first SAR ADC, and the two first capacitor arrays are correspondingly connected to a positive going analog input voltage and a negative going analog input voltage. For the first SAR ADC with an M-bit differential output, each first capacitor array includes M+1 capacitors, resulting in $2^{M+2}$ capacitors in total in the first SAR ADC.

It will be understood that among the M bit first capacitors in the first capacitor array, $C_1$ to $C_{M-1}$ are weight capacitors, and in the successive approximation conversion process, an output voltage of the first capacitor array can be increased/decreased by switching on/off the corresponding weight capacitors; and the $C_M$ is configured to generate a residual voltage signal to the second SAR ADC.

It will be understood that the circuitry of the first SAR ADC shown in FIG. 2 is merely exemplary, and in specific implementations, the circuitry of the first SAR ADC can be adaptively varied depending on the analog sampling mode. For example, when a single-ended sampling mode is adopted, the first SAR ADC is provided with only one first capacitor array.

In the embodiments of the present disclosure, the residue amplifier 30 is positioned between the first SAR ADC and the second SAR ADC. Specifically, an input end of the residue amplifier 30 is connected to a residual voltage output from the first digital-to-analog converter.

As shown in FIG. 2, in the case that the first SAR ADC adopts a differential upper plate sampling mode, the residue amplifier 30 employs a differential amplifier. In the case of using a differential amplifier, the residue amplifier 30 has two input end correspondingly connected to residual voltages (a positive going residual voltage and a negative going residual voltage) output from two first capacitor arrays. The residue amplifier 30 amplifies the residual voltage of $V_{ip1}$ and $V_{in1}$ to obtain differential analog input voltages $V_{ip2}$ and $V_{in2}$. Accordingly, the residue amplifier 30 has two output ends to output $V_{ip2}$ and $V_{in2}$ to the second SAR ADC.

It will be understood that the two input ends of the residue amplifier 30 may be further provided with respective switches (S1, S2), through which input of the residual voltage is controlled.

Figure 3:
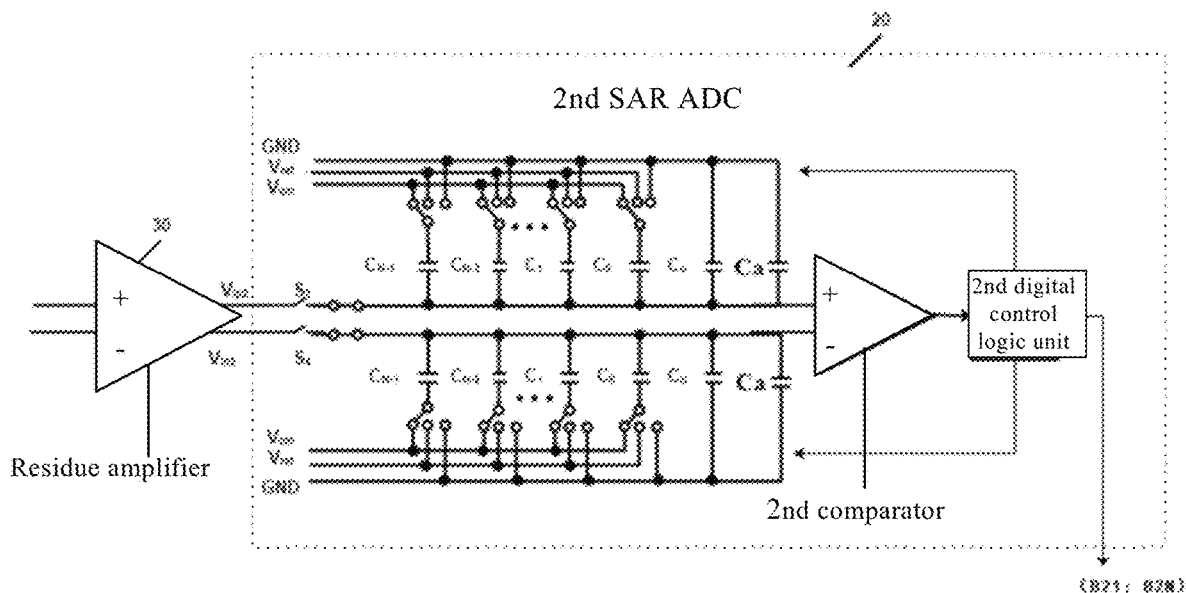
FIG. 3 is a schematic circuitry diagram of a second-stage successive approximation register analog-to-digital converter according to an embodiment of the present disclosure.

Referring to FIG. 3, FIG. 3 shows a schematic circuitry diagram of a second SAR ADC according to an embodiment of the present disclosure. As shown in FIG. 3, the second SAR ADC includes a second digital-to-analog converter, a second comparator and a second digital control logic unit sequentially connected. The second digital-to-analog converter includes a second capacitor array having one gain halving capacitor $C_a$, one second complement bit capacitor $C_0$, and N−1 bit second capacitors $C_1$ to $C_{N-1}$.

Capacitance values of the N−1 bit second capacitors $C_1$ to $C_{N-1}$ are sequentially increased by a power of 2 from small to large according to the number of bits. The capacitance value of a second capacitance $C_i$ may be expressed by: $C_i=2^{i-1}*CU$, where i=an integer selected from any one of 1 to N−1, and CU is a unit capacitance.

A capacitance value of the second complement bit capacitor $C_0$ is equal to a capacitance value of a first bit capacitor $C_1$ in the N−1 bit second capacitors $C_1$ to $C_{N-1}$, i.e., $C_0=CU$.

A capacitance value of the gain halving capacitor $C_a$ is a sum of the capacitance values of the N−1 bit second capacitors $C_1$ to $C_{N-1}$ and the second complement bit capacitor $C_0$, where the capacitance value of $C_a$ may be expressed by: $C_a=2^{N-1}*CU$.

As shown in FIG. 3, a first end of the gain halving capacitor $C_a$, a first end of the second complement bit capacitor $C_0$, and a first end of each of the N−1 bit second capacitors $C_1$ to $C_{N-1}$ are respectively connected to an output end of the residue amplifier 30. Second ends of the N−1 bit second capacitors $C_1$ to $C_{N-1}$ are respectively connected to a positive going reference voltage $V_{ref}$ and a negative going reference voltage (in this example, a reference ground GND is used as the negative going reference voltage) through a multi-way selection switch, and second ends of the gain halving capacitor $C_a$ and the second position-complementing capacitor $C_0$ are both constantly connected to a negative going reference voltage.

As shown in FIG. 3, the second SAR ADC samples the analog input voltage by an upper plate. In the second SAR ADC, an upper plate of each capacitor is connected to the output end of the residue amplifier 30, to access an analog input voltage (obtained by amplifying a residual voltage of the first SAR ADC by the residue amplifier 30) from the residue amplifier 30, while lower plates of the N−1 bit second capacitors $C_1$ to $C_{N-1}$ are connected to multiple reference signal sources through a multi-way selection switch. Exemplarily, each reference signal source may include a positive going reference voltage $V_{ref}$ and a negative going reference voltage (in this example, the reference ground GND is used as the negative going reference voltage). In some examples, the reference signal source further includes a common mode voltage $V_{CM}$. Lower plates of the gain halving capacitor $C_a$ and the second position-complementing capacitor $C_0$ are both constantly connected to a negative going reference voltage.

In the example shown in FIG. 3, the second SAR ADC adopts a differential upper plate sampling mode, and two output ends of the residue amplifier 30 output differential voltages $V_{ip2}$ and $V_{in2}$ (obtained by amplifying a residual voltage of $V_{ip1}$ and $V_{in1}$ of the first SAR ADC by the residue amplifier 30), where $V_{ip2}$ is a positive going analog input voltage, and $V_{in2}$ is a negative going analog input voltage.

In the upper plate differential sampling mode, two second capacitor arrays with the same structure are provided in the second SAR ADC, and the two second capacitor arrays are correspondingly connected to the positive going analog input voltage $V_{ip2}$ and the negative going analog input voltage $V_{in2}$. For the second SAR ADC with an N-bit differential output, each first capacitor array includes N+1 capacitors (one gain halving capacitor, one second complement bit capacitor, and N−1 bit second capacitors), resulting in 2N+2 capacitors in total in the second SAR ADC.

It will be understood that among the N−1 second capacitors in the second capacitor array, $C_1$ to $C_{N-1}$ are all weight capacitors, and in the successive approximation conversion process, an output voltage of the second capacitor array can be increased/decreased by switching on/off the corresponding weight capacitors.

It will be understood that the circuitry of the second SAR ADC shown in FIG. 3 is merely exemplary, and in specific implementations, the circuitry of the second SAR ADC can be adaptively varied depending on the analog sampling mode. For example, when a single-ended sampling mode is adopted, the second SAR ADC is provided with only one second capacitor array.

In the embodiments of the present disclosure, the digital coding unit 40 is connected to output ends of the first digital control logic unit and the second digital control logic unit. After amplification and quantization by the two-stage successive approximation register analog-to-digital converter and the residue amplifier 30, the analog input voltage generates (M+N) bit codes, and finally, the resulting (M+N−1) bit digital codes are output through the digital coding unit 40.

Figure 4:
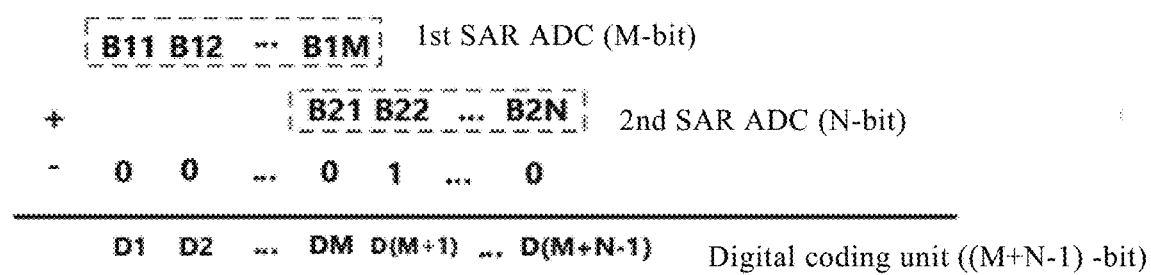
FIG. 4 is a schematic diagram showing an encoding process by a digital coding unit according to an embodiment of the present disclosure.

FIG. 4 shows a schematic encoding process by the digital coding unit 40. The first SAR ADC (M-bit SAR ADC) and the second SAR ADC (N-bit SAR ADC) jointly generate (M+N) bit codes, and finally, the resulting (M+N−1) bit binary digital output codes (D1:D (M+N−1)) are obtained based on the inter-stage dislocation accumulation mode of FIG. 3. To maintain full swing quantization, a subtraction process of entry digital codes is performed. A decoding circuit may implement the encoding process of FIG. 4 by means of a full adder (FA) and a half adder (HA).

According to the solution provided in the embodiments of the present disclosure, a gain halving capacitor is provided in a second digital-to-analog converter in the second-stage successive approximation register analog-to-digital converter 20, and a capacitance value of the gain halving capacitor is a sum of capacitance values of the rest capacitors in the second digital-to-analog converter, so that a capacitance DAC of the second-stage successive approximation register analog-to-digital converter 20 is doubled, inter-stage gain halving of the two-stage structure is implemented, and a gain of the residue amplifier 30 is reduced (the amplification factor of the residue amplifier 30 is reduced from $2^{M-1}$ to $2^{M-2}$), while a positive going reference voltage of the second-stage successive approximation register analog-to-digital converter 20 is not halved and remains consistent with the positive going reference voltage of the first-stage successive approximation register analog-to-digital converter 10, which can effectively reduce the power consumption while increasing the conversion speed, and can be adapted to a deep submicron CMOS process. After amplification and quantization by the two-stage successive approximation register analog-to-digital converter and the inter-stage amplifier, the analog input signal generates (M+N) bit digit signals, and finally, the (M+N−1) bit digit signals are output through the digital coding unit 40.

It should be noted that the solution provided in the embodiments of the present disclosure is not limited to be applied to a two-stage successive approximation register analog-to-digital converter, but also a successive approximation register analog-to-digital converter of three or more stages.

An embodiment of the present disclosure further provides an integrated circuit, including a pipelined successive approximation register analog-to-digital converter according to any one of the above embodiments.

In addition, an embodiment of the present disclosure further provides an electronic device, including a device body, and an integrated circuit as described above, where the integrated circuit is provided in the device body. Exemplarily, the electronic device may be a network device (e.g., a base station device) or the like.

According to the solution provided in the embodiments of the present disclosure, a gain halving capacitor is provided in a second digital-to-analog converter in the second-stage successive approximation register analog-to-digital converter, and a capacitance value of the gain halving capacitor is a sum of capacitance values of the rest capacitors in the second digital-to-analog converter, which can implement inter-stage gain halving of the two-stage structure, and reduce a gain of the residue amplifier, while a positive going reference voltage of the second-stage successive approximation register analog-to-digital converter is not halved and remains consistent with the positive going reference voltage of the first-stage successive approximation register analog-to-digital converter, which can effectively reduce the power consumption while increasing the conversion speed, and can be adapted to a deep submicron CMOS process. After amplification and quantization by the two-stage successive approximation register analog-to-digital converter and the inter-stage amplifier, the analog input signal generates (M+N) bit digit signals, and finally, the (M+N−1) bit digit signals are output through the digital coding unit.

While the present disclosure has been described with reference to several implementations above, the present disclosure is not limited to the above implementations, and various equivalent variations or replacements may be made by those skilled in the art without departing from the spirit of the present disclosure. Such equivalent variations or replacements fall into the scope as defined in the claims of the present disclosure.

What is claimed is:

1. A pipelined successive approximation register analog-to-digital converter, comprising:
   a first-stage successive approximation register analog-to-digital converter, including a first digital-to-analog converter, a first comparator and a first digital control logic unit sequentially connected, wherein the first digital-to-analog converter includes a first capacitor array having one first complement bit capacitor and M bit first capacitors, a first end of the first complement bit capacitor and a first end of each of the first capacitors are respectively connected to an analog input voltage, a second end of each of the first capacitors is connected to a positive going reference voltage or a negative going reference voltage through a multi-way selection switch, and a second end of the first complement bit capacitor is connected to a negative going reference voltage; a capacitance value of the first complement bit capacitor is equal to a capacitance value of a first bit capacitor in the M bit first capacitors, and capacitance values of the M bit first capacitors are sequentially increased by a power of 2 from small to large according to the number of bits, where M is an integer larger than 1;
a residue amplifier having an input end connected to a residual voltage output from the first digital-to-analog converter;
a second-stage successive approximation register analog-to-digital converter, including a second digital-to-analog converter, a second comparator and a second digital control logic unit sequentially connected, wherein the second digital-to-analog converter includes a second capacitor array having one gain halving capacitor, one second complement bit capacitor, and N−1 bit second capacitors, a first end of the gain halving capacitor, a first end of the second complement bit capacitor, and a first end of each of the second capacitors are respectively connected to an output end of the residue amplifier, a second end of each of the second capacitors is connected to a positive going reference voltage or a negative going reference voltage through a multi-way selection switch, and a second end of the gain halving capacitor, and a second end of the second complement bit capacitor are respectively connected to a negative going reference voltage, a capacitance value of the second complement bit capacitor is equal to a capacitance value of a first bit capacitor in the N−1 bit second capacitors, capacitance values of the N−1 bit second capacitors are sequentially increased by a power of 2 from small to large according to the number of bits, and a capacitance value of the gain halving capacitor is a sum of the capacitance values of the N−1 bit second capacitors and the second complement bit capacitor, where N is an integer greater than 1; and
a digital coding unit connected to output ends of the first digital control logic unit and the second digital control logic unit.

2. The pipelined successive approximation register analog-to-digital converter according to claim 1, wherein the analog input voltage is a differential voltage; and two first capacitor arrays are provided and correspondingly connected to a positive going input voltage and a negative going input voltage in the differential voltage.

3. The pipelined successive approximation register analog-to-digital converter according to claim 2, wherein the residue amplifier is a differential amplifier having two input ends correspondingly connected to residual voltages output from the two first capacitor arrays.

4. The pipelined successive approximation register analog-to-digital converter according to claim 3, wherein the differential amplifier has two output ends; and two second capacitor arrays are provided and correspondingly connected to the two output ends of the differential amplifier.

5. The pipelined successive approximation register analog-to-digital converter according to claim 1, wherein the residue amplifier has an amplification factor being an (M−2)$^{th}$ power of 2.

6. The pipelined successive approximation register analog-to-digital converter according to claim 1, wherein the second end of each first capacitor is further connected to a common mode voltage through the multi-way selection switch.

7. The pipelined successive approximation register analog-to-digital converter according to claim 1, wherein the second end of each second capacitor is further connected to a common mode voltage through the multi-way selection switch.

8. The pipelined successive approximation register analog-to-digital converter according to claim 1, further comprising a sample and hold circuit connected to the analog input voltage and the first digital-to-analog converter.

9. An integrated circuit; comprising a pipelined successive approximation register analog-to-digital converter the pipelined successive approximation register analog-to-digital converter comprising:
a first-stage successive approximation register analog-to-digital converter, including a first digital-to-analog converter, a first comparator and a first digital control logic unit sequentially connected, wherein the first digital-to-analog converter includes a first capacitor array having one first complement bit capacity and M bit first capacitors, a first end of the first complement bit capacitor and a first end of each of the first capacitors are respectively connected to an analog input voltage, a second end of the each of the first capacitors is connected to a positive going reference voltage or a negative going reference voltage through a multi-way selection switch, and a second end of the first complement bit capacitor is connected to a negative going reference voltage; a capacitance value of the first complement bit capacitor is equal to a capacitance value of a first bit capacitor in the M bit first capacitors, and capacitance values of the M bit first capacitors are sequentially increased by a power of 2 from small to large according to the number of bits, where M is an integer larger than 1,
a residue amplifier having an input end connected to a residual voltage output from the first digital-to-analog converter;
a second-stage successive approximation register analog-to-digital converter, including a second digital-to-analog converter, a second comparator and a second digital control logic unit sequentially connected, wherein the second digital-to-analog converter includes a second capacitor array having one gain halving capacitor, one second complement bit capacitor, and N−1 bit second capacitors, a first end of the gain halving capacitor, a first end of the second complement bit capacitor, and a first end of each of the second capacitors are respectively connected to an output end of the residue amplifier, a second end of each of the second capacitors is connected to a positive going reference voltage of a negative going reference voltage through a multi-way selection switch and a second end of the gain halving capacitor, and a second end of the second complement bit capacitor are respectively connected to a negative going reference voltage, a capacitance value of the second complement bit capacitor is equal to a capacitance value of a first bit capacitor in the N−1 bit second capacitors, capacitance values of the N−1 bit second capacitors are sequentially increased by a power of 2 from small to large according to the number of bits, and a capacitance value of the gain halving capacitor is a sum of the capacitance values of the N−1 bit second capacitors and the second complement bit capacitor, where N is an integer greater than 1; and a digital coding unit connected to output the ends of the first digital control logic unit and the second digital control logic unit.

10. An electronic device, comprising a device body, and an integrated circuit according to claim 9, wherein the integrated circuit is provided in the device body.

11. The integrated circuit according to claim 9, wherein the analog input voltage is a differential voltage; and two first capacitor arrays are provided and correspondingly connected to a positive going input voltage and a negative going input voltage in the differential voltage.

12. The integrated circuit according to claim 11, wherein the residue amplifier is a differential amplifier having two input ends correspondingly connected to residual voltages output from the two first capacitor arrays.

13. The integrated circuit according to claim 12, wherein the differential amplifier has two output ends; and two second capacitor arrays are provided and correspondingly connected to the two output ends of the differential amplifier.

14. The integrated circuit according to claim 9, wherein the residue amplifier has an amplification factor being an $(M-2)^{th}$ power of 2.

15. The integrated circuit according to claim 9, wherein the second end of each first capacitor is further connected to a common mode voltage through the multi-way selection switch.

16. The integrated circuit according to claim 9, wherein the second end of each second capacitor is further connected to a common mode voltage through the multi-way selection switch.

17. The integrated circuit according to claim 9, further comprising a sample and hold circuit connected to the analog input voltage and the first digital-to-analog converter.

* * * * *